United States Patent [19]

Berghäuser et al.

[11] 4,153,461

[45] May 8, 1979

[54] LAYER SUPPORT FOR LIGHT-SENSITIVE MATERIAL ADAPTED TO BE CONVERTED INTO A PLANOGRAPHIC PRINTING PLATE

[75] Inventors: Günter Berghäuser, Wiesbaden-Schierstein; Fritz Uhlig, Wiesbaden-Biebrich, both of Fed. Rep. of Germany

[73] Assignee: Hoechst Aktiengesellschaft, Fed. Rep. of Germany

[21] Appl. No.: 303,515

[22] Filed: Nov. 3, 1972

Related U.S. Application Data

[63] Continuation of Ser. No. 780,597, Dec. 2, 1968, abandoned.

[30] Foreign Application Priority Data

Dec. 4, 1967 [DE] Fed. Rep. of Germany ....... 1621478

[51] Int. Cl.[2] .......................... G03C 1/52; G03F 7/02; G03C 1/64; G03C 1/94

[52] U.S. Cl. .......................................... 96/75; 96/33; 96/86 R; 427/160; 427/327; 427/405; 428/469; 101/456; 101/459; 427/207 R

[58] Field of Search ...................... 96/86 R, 67, 75, 33; 117/34, 118, 75; 101/456, 459; 427/160, 207, 327, 405; 428/469

[56] References Cited

U.S. PATENT DOCUMENTS

| | | | |
|---|---|---|---|
| 2,871,119 | 1/1959 | Weegar et al. | 96/75 |
| 3,220,832 | 11/1965 | Uhlig | 117/75 |
| 3,301,674 | 1/1967 | Uhlig | 96/86 |
| 3,404,003 | 10/1968 | Steppan | 96/33 |

FOREIGN PATENT DOCUMENTS

| | | | |
|---|---|---|---|
| 273775 | 9/1967 | Australia | 96/75 |

OTHER PUBLICATIONS

Kirk–Othmer, *Encyclopedia of Chemical Technology,* vol. 1, 1963, pp. 979–980.

*Primary Examiner*—Edward C. Kimlin
*Attorney, Agent, or Firm*—James E. Bryan

[57] ABSTRACT

This invention relates to an aluminum base material for presensitized printing plates. The aluminum has an anodically produced oxide layer on the surface thereof, which layer is at least 0.0002 mm. thick, and the oxide layer is reacted with polyvinyl phosphonic acid.

3 Claims, No Drawings

LAYER SUPPORT FOR LIGHT-SENSITIVE MATERIAL ADAPTED TO BE CONVERTED INTO A PLANOGRAPHIC PRINTING PLATE

This is a continuation, of application Ser. No. 780,597, filed Dec. 2, 1968, now abandoned.

This invention relates to a layer support for use in light-sensitive material, which latter is adapted to be converted into a planographic printing plate. As is known, such a material includes a light-sensitive reproduction layer, in which the printing image is photomechanically produced, and a layer support which, from the production of the material until its processing into a printing plate, carries the reproduction layer and is stored therewith until the material is used. After the production of the printing image, the support carries the printing image and simultaneously forms the image background in the image-free areas. It is a requirement of a layer support suitable for the production of a printing plate that the printing image areas developed from the reproduction layer of the material adhere thereto very firmly. Further, it must have a hydrophilic surface and the repelling effect thereof with respect to oleophilic printing inks must not be reduced in efficiency under the multiple requirements of the printing procedure. The layer support always should have a surface structure which is porous to a certain degree so that the surface can retain sufficient water to have an adequate repelling effect with respect to the printing inks used for printing.

It is further known that aluminum oxide layers prepared by anodic oxidation on aluminum foils or sheets and having thicknesses of at least 0.0002 mm. are extraordinarily abrasion-resistant and that aluminum foils thus provided with oxide layers have proved very useful, inter alia, for the production of printing plates because a great number of copies can be produced therewith. When printing images are photomechanically produced on such a printing plate, the applied light-sensitive layers can penetrate too deeply into the porous aluminum oxide layer, which has certain known disadvantages. These disadvantages, however, have been overcome. For this purpose, the aluminum oxide layer has been contacted with sodium silicate solution, and an aluminum silicate layer probably has been formed thereby. This treatment has prevented the light-sensitive reproduction layers applied onto the oxidized aluminum surfaces from penetrating undesirably deeply into the surfaces.

For the same purpose, according to a similar process, the aluminum oxide surface has been treated with an aqueous solution of ammonium bichromate or alkali bichromate, iron ammonium oxalate or a dyestuff which may chemically react with aluminum oxide surfaces. But these processes also have disadvantages. Treatment with alkali silicate thus entails the requirement of thorough rinsing with water when the support obtained is to be provided with a storable light-sensitive layer adapted to be stored in the thus sensitized state over a long period without deterioration. But even after thorough rinsing with water or even neutralization with dilute acids, the silicate layer, or perhaps alkali residues remaining from the silicate solution, effect a certain deterioration. When the mentioned aqueous chromate solutions are used a barely hydrophilic intermediate layer is obtained, the chromate content of which, presumably because of its oxidizing effect, often adversely affects the light-sensitive layer to be applied in that the layer is discolored, which impairs the light-permeability thereof so that the light-sensitivity of the layer is reduced. The same applies to the treatment of the aluminum oxide surface with an iron ammonium oxalate solution, the iron content of which may cause a dark discoloration. When using aqueous solutions of dyestuffs which chemically react with the aluminum oxide surface, the hydrophilic properties of the aluminum layer are reduced by a certain degree, with the result that a printing plate material produced with a support pretreated in this manner more easily tends to scum during printing than does a printing plate the aluminum oxide surface of which has not been pretreated with such a dyestuff solution. Also the aluminum oxide surfaces chemically altered by means of dyestuffs cannot be easily corrected.

The present invention provides a layer support, having improved surface properties, from a known support of aluminum having a surface layer obtained by chemical reaction of an at least 0.0002 mm. thick aluminum oxide layer produced by anodic oxidation, which support avoids the beforementioned disadvantages of the known supports or possesses them to only a small degree. The surface layer of the invention is produced by reacting a polyvinyl phosphonic acid solution with the at least 0.0002 mm. thick layer of anodically oxidized aluminum.

For the production of the support in accordance with the invention, a relatively thick oxide layer of 0.0002 to 0.01 mm. thickness is produced by anodic oxidation on an aluminum foil which may be in the form of a web or sheet. This is performed in known manner, e.g. by anodic oxidation in a bath having a content of 25 percent by weight of sulfuric acid with the application of current of 2 to 6 amperes per $cm^2$ and 10 to 20 volts. The formation of the oxide layer takes place under these process conditions within approximately 5 to 10 minutes. The thus oxidized aluminum surface is then treated with an aqueous solution of polyvinyl phosphonic acid, hot solutions preferably being employed. Treatment with the solution may be performed, for example, by applying the solution with a brush, a sponge, a spraying device or a whirl coater. Most advantageous generally is to immerse the sheet or the unwound web in a hot aqueous polyvinyl phosphonic acid solution. The polyvinyl phosphonic acid employed has a polymerization degree in the range of 100 units, for example, which corresponds to a molecular weight in the range of about 10,000. Instead of water, there also may be used water in admixture with organic readily volatile liquids soluble in water, e.g. ethyl alcohol, tetrahydrofuran, acetone or methyl glycol acetate. Depending on the temperature and the polyvinyl phosphonic acid concentration, the duration of treatment is a few seconds to several minutes. Treatment time generally is in the range from 2 seconds to 10 minutes, preferably from 30 seconds to 5 minutes, at temperatures from 40° to 95° C. with the use of approximately 0.01 to 2 percent by weight solutions of the polyvinyl phosphonic acid. Before or after or before as well as after treatment with polyvinyl phosphonic acid, a so-called sealing process may be performed in known manner with hot water or steam, the pores being partially closed thereby.

After the application of the polyvinyl phosphonic acid solution to the aluminum oxide surface, the latter is wet with the solution applied and has an excess of polyvinyl phosphonic acid thereon, i.e. free polyvinyl phosphonic acid which is not chemically bonded to the aluminum oxide surface. When the support is to be immediately provided with a light-sensitive layer, which is used to photomechanically produce the printing image, it is advisable to rinse the surface, wetted with the polyvinyl phosphonic acid, with water and then dry it, advantageous temperatures employed being in the range of 50° to 150° C. When, however, a light-sensitive layer is to be applied substantially later, then it is better to dry the excess of polyvinyl phosphonic acid on the surface and to remove the excess polyvinyl phosphonic acid only shortly before the application of the image-accepting printing ink, or shortly before the application of the light-sensitive layer, by rinsing with water.

Although it has not been definitely established, it is assumed that the polyvinyl phosphonic acid reacts with the aluminum oxide within the capillary structure of the latter with the formation of a hydrophilic intermediate layer. The intermediate layer is not removed from the surface either during wiping of the surface with water, as it is employed for maintaining printing plates wet during printing, or by acid or alkaline developer liquids, as generally used for developing exposed material for the production of printing plates.

Suitable light-sensitive reproduction layers to be used on the support according to the invention are generally all known layers which undergo changes in their chemical or physical properties by the action of visible ultraviolet or infrared light or by the action of heated bodies. Very advantageous is, for example, presensitized material for the production of printing plates which includes on the support as a light-sensitive substance, an ester or an amide of an o-naphthoquinone diazide sulfonic acid, or a salt of p-diazodiphenylamine or one of its nuclear substitution products, or a condensation product of these diazonium salts with formaldehyde. The use of p-quinone diazides of benzene or of organic photoconductors as light-sensitive substances has also proved beneficial. In addition to the light-sensitive substances, the reproduction layers, of course, also may contain in known manner other constituents, e.g. resins, dyestuffs, plasticizers, and the like.

Treatment of aluminum supports with polyvinyl phosphonic acid in the production of light-sensitive material for manufacture of printing plates is known. It also could be assumed that the known use of polyvinyl phosphonic acid on aluminum surfaces results in an anchorage of the polyvinyl phosphonic acid by chemical reaction with an aluminum oxide layer which, as is known, is present on every aluminum surface in contact with the atmosphere. However, it could be expected that, in treating a relatively thick anodically produced aluminum oxide layer with polyvinyl acid which, according to its chemical structure may be regarded as a vinyl resin, the pores of the porous surface of the aluminum oxide layer would be completely filled so that the valuable properties, which the relatively thick aluminum oxide layer has as a result of the porosity thereof, in the sensitization with light-sensitive layers would be lost. Surprisingly, this is not the case but the valuable properties of the porous, relatively thick (more than 20 times thicker than one obtained by air oxidation) aluminum oxide layer are maintained whereas the disadvantages thereof are almost completely overcome. In any event, treatment with polyvinyl phosphonic acid considerably improves the hydrophilic properties of the aluminum oxide surface so that printing plates prepared using the supports of the invention do not tend to scum. Because of their excellent hydrophilic properties, the printing plates advantageously may be used in proof presses in which automatic wetting of the printing plates during printing is not provided. Furthermore, the aluminum oxide surface which, from a chemical point of view, has an amphoteric character is converted by treating it according to the invention with polyvinyl phosphonic acid into a surface of a weakly acid character, which has the advantage that, in many cases, removal of the unexposed parts of the reproduction layer is facilitated, viz. when the reproduction layers contain acid constituents, e.g. phenol resins or the advantageously acid diazo compounds.

In the following examples, the percentages are by weight.

EXAMPLE 1

An electrolytically roughened aluminum plate with a 0.008 mm. thick oxide layer is immersed for 4 minutes at 60° C. into a bath consisting of a solution of 0.1 percent of polyvinyl phosphonic acid in distilled water. The molecular weight of the polyvinyl phosphonic acid is in the range of 10,000. The plate is then rinsed with distilled water and dried at 100° C. It is then coated with a solution containing 2 percent of naphthoquinone-(1,2)-diazide-(2)-5-sulfonic ester of 2,3,4-trihydroxy-benzophenone, 5 percent of a novolak resin and 0.1 percent of a polyvinyl acetate resin in ethylene glycol monoethyl ether. The novolak resin is a neutral phenol resin of the novolak type with a melting range of about 108° to 118° C., the polyvinyl acetate resin is a resin the softening range of which is between 140° and 160° C. and which, in the form of a 20 percent solution in ethyl acetate at 20° C. has a viscosity of 110 to 150 cp. The applied solution is dried with hot air.

The material thus obtained may be stored in the dark without deterioration of several months before use. In use, it is exposed to light under a diapositive and wiped over with a 3 percent trisodium phosphate solution, the exposed layer parts being completely removed thereby. After rinsing with water and wiping over with a 1 percent aqueous phosphoric acid solution, it is inked up with greasy ink. If desired, undesired image parts are completely etched away by dabbing with one of the usual correcting agents. An offset printing plate is thus obtained from which very long runs can be obtained without the printed image becoming weaker or the background being scummed.

EXAMPLE 2

An electrolytically roughened aluminum tape with a 0.0002 mm. thick oxide layer is drawn for 30 seconds at 80° C. through a solution of 1.5 percent of polyvinyl phosphonic acid and 0.2 percent of vinyl phosphonic acid in water. After rinsing with water and drying, the aluminum tape is coated by roller application with a light-sensitive solution containing 0.8 part by weight of a condensate of paraformaldehyde and diphenylamine-4-diazonium chloride and 0.5 part by weight of polyvinyl acetate in 100 parts by weight of ethylene glycol monomethyl ether. The thus coated tape is dried in the hot condition and cut into printing plate sizes. The thus obtained printing plate material can be stored in the dark for many months without deterioration.

For the production of a printing forme, a presensitized printing plate, prepared as described above, is exposed to light under a photographic negative and then developed with an aqueous solution containing 4 percent of gum arabic and 2 percent of magnesium nitrate. During development, the unexposed areas of the layer are completely removed so that the bared aluminum oxide surface appears silvery and glossy. The image areas are then inked up by wiping over the entire surface with greasy ink and an offset printing forme is thus obtained from which long printing runs of excellent quality can be obtained.

EXAMPLE 3

An aluminum plate provided with an electrolytically produced oxide layer and treated with polyvinyl phosphonic acid as described in Example 1 is coated with a solution containing, as the light-sensitive substance, 2.6 percent of 1-(4′-methylbenzene-1′-sulfonyl-imino)-2-(2″-ethyl-phenylaminosulfonyl)-benzoquinone-(1,4)-diazide-(4) and 0.6 percent of a pure unhardenable neutral phenol resin of the novolak type with a melting range of 75° to 83° C., in ethylene glycol monomethyl ether. The applied layer is dried.

In use, the thus obtained material is exposed to light under a negative and wiped over with an aqueous alkaline solution containing 1.8 percent of sodium metasilicate and 0.5 percent of trisodium phosphate in water. The unexposed layer parts are dissolved away thereby. After rinsing with water, the plate is inked up with greasy ink. A printing plate suitable for long printing runs is obtained.

EXAMPLE 4

An aluminum plate, pretreated as described in Example 1, is sensitized with a solution of 1.5 parts of concentrated ammonia water, 90 parts of water, 3 parts of Hammersten casein (contains at most 2 percent of ash and at most 0.2 percent of fat), 1 part of polyvinyl pyrrolidone, and 2 parts of the sodium salt of 4,4′-diazidostilbene-2,2′-disulfonic acid.

For the production of a printing forme, the thus obtained material is exposed to light under a diapositive and the areas not struck by light are removed by spraying with water. To make the resulting negative image more visible, a 0.5 percent aqueous methylene blue solution is poured over the surface of the plate, the image thereon being colored dark blue thereby. The plate is then rinsed with water and dried. If desired, corrections are subsequently made in known manner and defects eliminated. The plate is then lacquered by wiping it over with a cellulose pad soaked with a lacquer containing 7.5 percent of a copolymer of 85 percent of vinyl chloride, 14 percent of vinyl acetate, and 1 percent of maleic acid (see DAS No. 1,194,260, Example 1). The lacquer adheres very firmly, in the bared image areas, to the aluminum oxide treated with polyvinyl phosphonic acid. The entire image area is then inked up with greasy ink and, by wiping it over with a solution of 2.5 percent of sodium metasilicate and 1.6 percent of trisodium phosphate in water, the hardened layer parts on the surface of the plate, and therewith the lacquer in the form of a porous layer only weakly anchored, are removed. A planographic printing forme is thus obtained which can be used for long printing runs.

EXAMPLE 5

An electrolytically roughened aluminum plate as described in Example 1 but treated only with 0.05 percent polyvinyl phosphonic acid solution is sensitized with a solution containing 4 percent of 1-((4′-methylbenzene-1′-sulfonyl)-imino)-2-(2″,5″-dimethyl-phenylaminosulfonyl)-benzoquinone-(1,4)-diazide-(4), 0.8 percent of a reaction product of 44 percent of a phenolaldehyde resin novolak and 56 percent of chloroacetic acid (see the production of Resin A in Example 5 of German Pat. No. 1,053,930), and 1.2 percent of a styrene copolymer containing carboxyl groups and having a specific weight of 1.15 and a decomposition temperature of 200° to 230° C., in a mixture of equal parts of methyl glycol and tetrahydrofuran. In use, the thus obtained material is exposed to light under a photographic negative, developed, and inked up as described in Example 3. The thus obtained printing plate yields a long printing run of good quality.

EXAMPLE 6

A mechanically roughened and subsequently anodized aluminum tape with an aluminum oxide layer thickness of 0.004 mm. is partially sealed by treating it for 4 minutes in hot water and then is drawn for 60 seconds at 90° C. through a solution of 0.5 percent of polyvinyl phosphonic acid in distilled water. After rinsing, the aluminum tape is sensitized with a light-sensitive solution containing 3.0 parts by weight of a condensate of formaldehyde and 3-methoxy-diphenylamine-4-diazonium chloride and 4.0 parts by weight of an epoxy resin having a melting point of 70° C. and an epoxy equivalent weight of about 500 (the product commercially known under the trade name Epikote 1001), in 100 parts by weight of ethylene glycol monoethyl ether.

The thus coated tape is cut into printing plate sizes. For the production of a printing forme, one of the presensitized plates is exposed to light under a negative and developed with an aqueous solution containing 1 percent by weight of phosphoric acid, 3 percent by weight of magnesium sulfate, and 3 percent by weight of sodium sulfate in water. After rinsing, the plate is inked up with greasy ink.

It will be obvious to those skilled in the art that many modifications may be made within the scope of the present invention without departing from the spirit thereof, and the invention includes all such modifications.

What is claimed is:

1. An aluminum base, for use in the manufacture of presensitized printing plates, having a surface which is the reaction product of polyvinyl phosphonic acid with an anodically produced aluminum oxide layer having a thickness in the range of about 0.0002 to 0.01 mm.

2. An aluminum base according to claim 1 including a light-sensitive layer on the surface.

3. An aluminum base according to claim 2 in which the light-sensitive layer contains a compound selected from the group consisting of diazo and azido compounds.

* * * * *